US006917431B2

(12) United States Patent
Soljacic et al.

(10) Patent No.: US 6,917,431 B2
(45) Date of Patent: Jul. 12, 2005

(54) MACH-ZEHNDER INTERFEROMETER USING PHOTONIC BAND GAP CRYSTALS

(75) Inventors: Marin Soljacic, Somerville, MA (US); Shanhui Fan, Somerville, MA (US); Mihai Ibanescu, Piatra Neamt (RO); Steven G. Johnson, St. Charles, IL (US); John D. Joannopoulos, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/146,430

(22) Filed: May 15, 2002

(65) Prior Publication Data

US 2003/0011775 A1 Jan. 16, 2003

Related U.S. Application Data

(60) Provisional application No. 60/291,105, filed on May 15, 2001.

(51) Int. Cl.[7] .............................................. G01B 9/02

(52) U.S. Cl. ................................................... 356/477

(58) Field of Search ............................... 356/450, 477; 250/227.19, 227.27; 385/12, 13, 14

(56) References Cited

U.S. PATENT DOCUMENTS

| 5,526,449 | A |  | 6/1996 | Meade et al. |  |
|---|---|---|---|---|---|
| 5,579,033 | A |  | 11/1996 | Rutledge et al. |  |
| 5,784,400 | A |  | 7/1998 | Joannopoulos et al. |  |
| 6,002,522 | A | * | 12/1999 | Todori et al. | 359/573 |
| 6,058,127 | A |  | 5/2000 | Joannopoulos et al. |  |
| 6,064,506 | A |  | 5/2000 | Koops |  |
| 6,175,671 | B1 |  | 1/2001 | Roberts |  |

FOREIGN PATENT DOCUMENTS

| EP | 1 205 788 A1 | 9/2000 |
|---|---|---|
| WO | WO 98/53350 | 11/1998 |
| WO | WO 02/14913 | 8/2001 |

OTHER PUBLICATIONS

"High Transmission through Sharp Bends in Photonic Crystal Waveguides," Mekis et al. *Physical Review Letters.* Oct. 28, 1996. vol. 77, No. 18.
"Channel Drop Tunneling through Localized States," Fan et al. *Physical Review Letters.* Feb. 2, 1998. vol. 80, No. 5.
"Light speed reduction to 17 metres per second in an ultracold atomic gas," Hau et al. *Nature.* Feb. 18, 1999. vol. 397.
"Tight-Binding Description of the Coupled Defect Modes in Three-Dimensional Photonic Crystals," Bayindir et al. *Physical Review Letters.* Mar. 6, 2000. vol. 84, No. 10.
"Waveguide branches in photonic crystals," Fan et al. *Optical Society of America.* Feb. 2001. vol. 18, No. 2.
"Three-dimensionally Periodic Dielectric Layered Structure with Omnidirectional Photonic Band Gap," Johnson et al. *Applied Physics Letters.* Nov. 27, 2002. vol. 77, No. 22.
"Tight-Binding Parametrization for Photonic Band Gap Materials," Lidorikis et al. *Physical Review Letters.* Aug. 17, 1998. vol. 81, No. 7.

(Continued)

Primary Examiner—Gregory J. Toatley, Jr.
Assistant Examiner—Michael A. Lyons
(74) Attorney, Agent, or Firm—Gauthier & Connors LLP

(57) ABSTRACT

A photonic crystal optical switch having a periodic dielectric structure including at least one input waveguide. First and second waveguide arms branch from the input waveguide in which the relative optical path lengths of electromagnetic radiation within the arms are controlled by stimuli. At least one output waveguide that combines the electromagnetic radiation propagating within the first and second waveguide arms.

29 Claims, 5 Drawing Sheets

OTHER PUBLICATIONS

"Controlling Photons Using Electromagnetically Induced Transparency," Lukin et al. Nature. Sep. 20, 2001. vol. 413.

"High Transmission through Sharp Bends in Photonic Crystal Waveguides," Mekis et al. *The American Physical Society.* Oct. 28, 1996. vol. 77, No. 18.

"Emulation of Two-dimensional Photonic Crystal Defect Modes in a Photonic Crystal with a Three-dimensional Photonic Band Gap," Povinelli et al. *Physical Review B.* 2001. vol. 64.

"Strong Localization of Photons in Certain Disordered Dielectric Superlattices," Sajeev John. *Physical Review Letters.* Jun. 8, 1987. vol. 58, No. 23.

"Compact, Low-Crosstalk, and Low-Propagation-Loss Quantum-Well Y-Branch Switches," Sneh et al. *IEEE Photonics Technology Letters.* Dec. 1996. vol. 8, No. 12.

"Inhibited Spontaneous Emission in Solid-State Physics and Electronics," Eli Yablonovitch. *Physical Review Letters.* May 18, 1997. vol. 58, No. 20.

"Single-Mode Waveguide Microcavity for Fast Optical Switching," Villeneuve et al. *Optical Society of America.* Dec. 15, 1996. vol. 21, No. 24.

"Coupled-Resonator Optical Waveguide: a proposal and analysis," Yariv et al. *Optical Society of America.* Jun. 1, 1999. vol. 24, No. 11.

"Fabrication of Photonic Band-Gap Crystals," Cheng et al. *Journal of Vacuum Science & Technology.* 1995. Nov./Dec. No. 6.

"Extremely Large Group- Velocity Dispersion of Line-Defect Waveguides in Photonic Crystal Slabs," Notomi et al. *The American Physical Society.* Dec. 17, 2001. vol. 87, No. 25.

"Observation of small group velocity in two-dimensional AlGaAs- based photonic crystal slabs," Inoue et al. *The American Physical Review.* Mar. 12, 2002. vol. 65.

"Propagation and second-harmonic generation of electromagnetic waves in a coupled-resonator optical waveguide," Xu et al. *Optical Society of America.* Mar. 3, 2000. vol. 17, No. 3.

"Coupled Resonator Optical Wveguides," Mookherjea et al. *IEEE Journal of Selected Topics in Quantum Electronics.* May/Jun. 2002. vol. 8, No. 3.

* cited by examiner

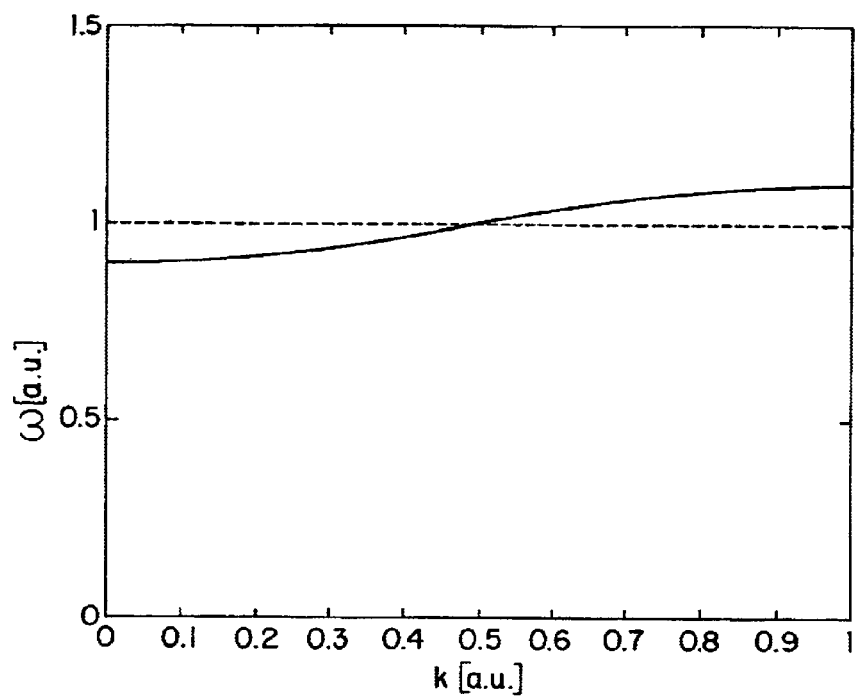
FIG. 4
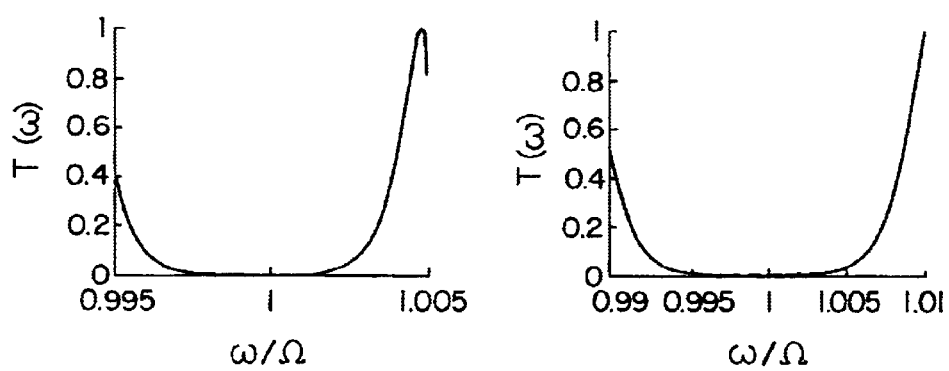
FIG. 5A          FIG. 5B

US 6,917,431 B2

MACH-ZEHNDER INTERFEROMETER USING PHOTONIC BAND GAP CRYSTALS

PRIORITY INFORMATION

This application claims priority from provisional application Ser. No. 60/291,105 filed May 15, 2001.

SPONSORSHIP INFORMATION

This invention was made with government support under Grant No. Dmr-9808941 awarded by NSF. The government has certain rights in this invention.

BACKGROUND OF THE INVENTION

Photonic band gap crystals are artificially created structures in which the index of refraction is periodically modulated in 1D, 2D, or 3D, with period of modulation comparable to the wavelength of the carrier light. For a 2D example, see FIG. 1A. FIG. 1A is a schematic diagram of a 2D PBG crystal 100, in which the dark circles 102 represent regions of a high index of refraction.

If the amplitude of the index variation is large enough, a photonic band gap appears, and light of certain wavelength ranges is not allowed to propagate. In many ways, PBG crystals present for photons what semiconductors present for electrons. Therefore, they are considered to be a very promising direction for building optical integrated circuitry. In an integrated optical circuit, the carrier light would conceivably be guided down line defects in PBG crystals. Exemplary line defects are illustrated in FIGS. 1B and 1C.

FIG. 1B is a schematic diagram of a line defect 104 in the 2D PBG crystal 100. FIG. 1C is a schematic diagram of another type of line defect 106 in the 2D PBG crystal. The signal propagates down the line defect 106 by hopping between the weakly coupled cavities. In such defects, light can be easily made to bend around a corner (like in FIG. 1D), or split equally into two branches with no reflection backwards. FIG. 1D is a schematic diagram of a line defect 108 in the 2D PBG crystal 100 that bends light at 90°. 100% transmission can be obtained for certain carrier frequencies around such bends. Furthermore, add-drop filters for light of different carrier frequencies have also been proposed.

All the effects described heretofore are passive. Once a device has been built, its properties cannot be altered. Nevertheless, it would be useful to have a device whose properties can be altered with some external stimulus: electrical, optical, or mechanical. Some proposals in this direction have already been made. The invention provides a class of fast (up to more than O(1 THz)), compact, wide bandwidth, small power devices, which can be operated with electrical or optical stimuli, and are easy to implement in many PBG crystals. In order to achieve these desirable specifications, properties of some especially designed line defects in PBG crystals are used.

SUMMARY OF THE INVENTION

A Mach-Zehnder interferometer is provided using specially designed line defects in photonic band gap (PBG) crystals. In the line defects in question, the carrier light has a very low group velocity, a characteristic shape of the dispersion relation, and its dispersion relation responds in a specified way to the (electrical or optical) control stimulus. The device can be used as an electrically (or optically) induced on-off switch, or a router between two different outputs. Furthermore, it can also be used for optical imprinting and all-optical logical gates. To illustrate this, an optical AND, an optical NAND gate, and an optical fan-out device are provided. The main advantages of the device are: its small size (volume as small as $O(500\lambda^3)$, where $\lambda$ is the vacuum wavelength of the carrier light), large bandwidth of operation (easily achievable Q of O(100)), operational rate of more than 1 THz in some implementations, typically very small power requirements, and easy implementation in many PBG crystals.

Accordingly, the invention provides a photonic crystal optical switch having a periodic dielectric structure including an input waveguide, first and second waveguide arms branching from the input waveguide in which the relative optical path lengths of electromagnetic radiation within the arms are controlled by stimuli, and at least one output waveguide that combines the electromagnetic radiation propagating within the first and second waveguide arms.

BRIEF DESCRIPTION OF THE DRAWINGS

FIG. 4 is a graph of another exemplary dispersion curve of the invention;

FIGS. 5A–5D are graphs of transmission curves of devices of the invention for a range of ωs;

DETAILED DESCRIPTION OF THE INVENTION

The invention provides an integrated optics device that can be used as a very fast electrically, or optically controlled switch, or else as an all-optical logical gate. The device is compared with already existing devices that have similar performance. Probably the fastest and smallest interferometers that consume the least power are either Mach-Zehnder waveguide interferometers, typically implemented in LiNbO₃, directional coupler switches implemented with InGaAlAs/InAlAs multiquantum wells, or InP-based quantum-well Y-branch switches. These devices are typically O(1 mm) or longer. The invention involves a class of devices, which achieve the same performance, but with length an order of magnitude smaller. Because of the smaller size, the power needed to operate these devices is also significantly reduced. This is achieved by exploring a certain class of line defects in photonic band gap crystals.

Figure 2:
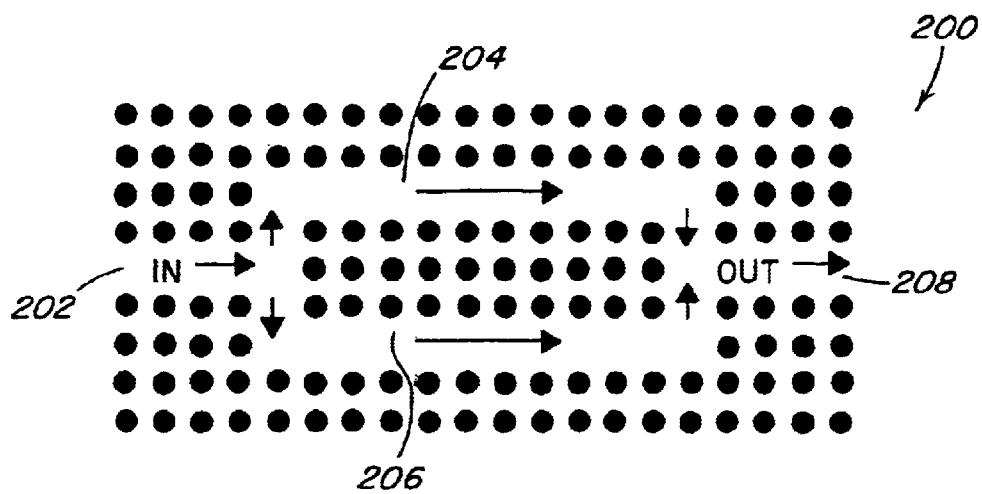
FIG. 2 is a schematic diagram of a Mach-Zehnder interferometer 200 configured in PBG crystals in accordance with the invention.

It is desirable to configure a fast device, i.e., response time of 1 ns or less. So, the only external stimuli available are typically electrical or optical types. The corresponding changes in the index of refraction are δn/n of O(0.001) or less. Using only this tiny change, one would like to switch the transmission of the device from 1 to 0. Accordingly, FIG. 2 is a schematic diagram of a Mach-Zehnder interferometer 200 configured in PBG crystals in accordance with the invention. Signals are split equally, at an input 202, between an upper 204 and a lower 206 branch of the device.

Some stimulus changes the index of refraction at various points of each branch, thereby influencing the difference between the phase shifts the signals acquire when traversing their corresponding branches. Stimulus refers to the externally (electrically, or optically) induced change in the index of refraction, or else a self-induced change in the index of refraction. For the analysis below, it does not matter whether the change in the index of refraction is self-induced by the signal itself, or externally induced. It only matters how large this change is. In addition, examples of possible implementations for real applications (in which it matters whether the change is externally, or self-induced) are provided. Consequently, one can design the device so that the stimulus produces the two signal branches to interfere either constructively or destructively at the output 208, thereby turning the device on or off.

The physical limits of the size of similar devices when they are implemented in usual integrated-optics waveguides will now be described. Suppose the length of each branch is L, and suppose that in the lower branch the effective index of refraction is n, while in the upper branch it is n+δn. The total phase shift acquired in the upper branch is $2\pi L(n+\delta n)/\lambda$, while in the lower branch it is $2\pi Ln/\lambda$. Since the biggest $\delta n/n$ at our disposal is O(0.001), in order to make the phase shift difference between the two branches to be $\pi$, we need to have $2\pi L\delta n/\lambda=\pi=\rightarrow$L is of O(400$\lambda$). Please note that L sets the length of the device.

The invention uses properties of certain line defects in certain PBG crystals in order to reduce the length of the device by an order of magnitude, compared to the analysis of the previous paragraph. The observation goes as follows. The induced change in the total phase shift (when traveling down one branch) for a given $\omega$ is given by: $[k(\omega,n+\delta n)-k(\omega,n)]*L$. In order to minimize L (keeping the phase shift fixed), $k(\omega,n+\delta n)-k(\omega,n)$ should be maximized. Such a small change in n (i.e. n→n+δn) will cause just a tiny change in $\omega(k)$. Typically, in real physical photonic band gap crystals, to the lowest order in $\delta n/n$, $\omega(k,n+\delta n)\approx(1+\epsilon)\omega(k,n)+\delta\omega_0$, where $\delta\omega_0/\omega(k=0,n)$ and $\epsilon$ are both $O(\delta n/n)$. The novelty of our idea is that if a PBG crystal is used with a low group velocity $v_G$, even a small change of such type will lead to a rather large $\Delta k \equiv k(\omega,n+\delta n)-k(\omega,n)$ since $\Delta k \sim \Delta\omega/v_G$ (where $\Delta\omega$ is the change of the $\omega$ of interest). Group velocity of a signal, $v_G$, is the velocity at which energy of the signal propagates. Group velocities as small as c/100 or c/1000, where c is the speed of light in vacuum, are easily achievable in photonic crystals.

Figure 3:
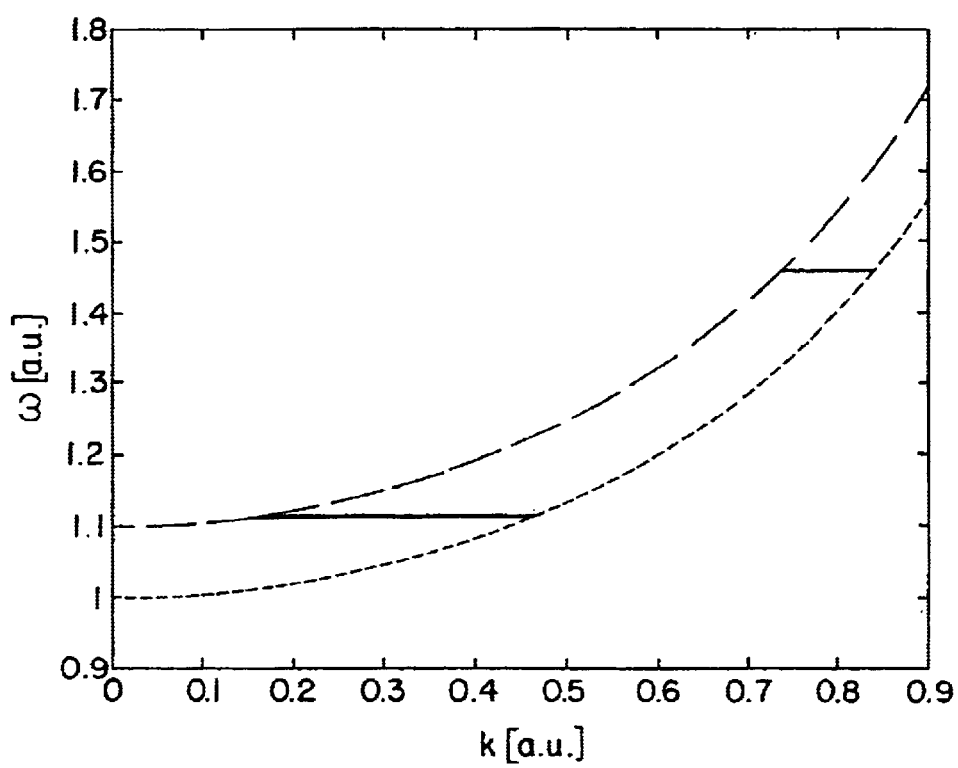
FIG. 3 is a graph of the behavior of a dispersion curve of the invention under an applied stimulus.

FIG. 3 is a graph of the behavior of a dispersion curve of the invention under an applied stimulus. The dotted line represents the dispersion curve without the stimulus applied, while the dashed line represents the curve with the stimulus applied. In the case presented here, the stimulus scales the whole curve by a constant factor. It is seen that in the regions of small group velocities, the difference between the two ks (for a given $\omega$) is large. To see this, compare the lengths of the two solid lines in the plot. As shown in FIG. 3, (for the "shift" in the dispersion curve of the type described) the smaller the group velocity, the larger the $k(\omega,n+\delta n)-k(\omega,n)$, and thereby the smaller the length of the device. It is well known that small group velocities appear often in PBG crystals. This is especially the case for some line defects in PBG crystals.

In addition, it is desirable that the device of the invention have the same behavior over as large a bandwidth as possible. It is assumed for purposes of description that the useful or wide bandwidth is defined as $(f2-f1)/[(f2+f1)/2]$ where f2 is the frequency of the top of the useful band, and f1 is the frequency of the bottom of the useful band. In this notation, a particular frequency f0 is called useful if transmission is >99% for f0 when the device is in its ON state, and the transmission is <1% for f0 when the device is in its OFF state. In accordance with the invention, it has been found that the wide or useful bandwidth can be configured to be larger than $0.4(v_G/c)$, $0.2(v_G/c)$, $0.1(v_G/c)$, and $0.05(v_G/c)$.

Accordingly, $k(\omega,n+\delta n)-k(\omega,n)$ should be as independent of $\omega$ as possible for a significant span of $\omega$'s. Any line defect in PBG crystals that satisfies this will do the job. However, perhaps the most easily realizable system in PBG crystals that satisfies this is the one that has the dispersion coefficient $d^2\omega/dk^2$ as close to zero as possible, and whose dispersion relation under the stimulus of interest shifts "mostly" by a constant factor (preserving its slope). To see this, imagine that one has a dispersion relation of the form $\omega(k)=\omega_0+\omega_1(k)$ (where $\omega_1(k=0)=0$, and $\omega_1(k)$ is significantly smaller than $\omega_0$ over the range of k's of interest, as in FIG. 4). Then, in a real physical system, a typical shift of the curve (well mimicked by $\omega\rightarrow(1+\epsilon)\omega(k)+\delta\omega_0$, where $\epsilon$ and $\delta\omega_0$ are small) will result in $\omega_0+\omega_1(k)\rightarrow(1+\epsilon)\omega_0+\delta\omega_0+(1+\epsilon)\omega_1(k)$. Since $\omega_1<<\omega_0\rightarrow\Delta k(\omega)$ is fairly constant in $\omega$.

Figure 1A:
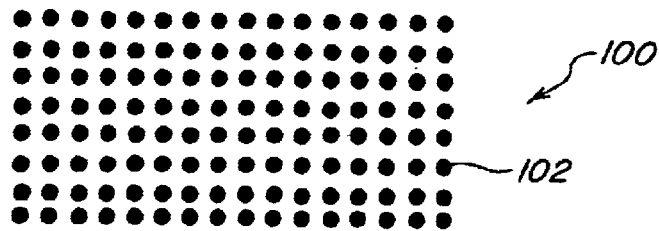
FIG. 1A is a schematic diagram of a 2D PBG crystal.
Figure 1B:
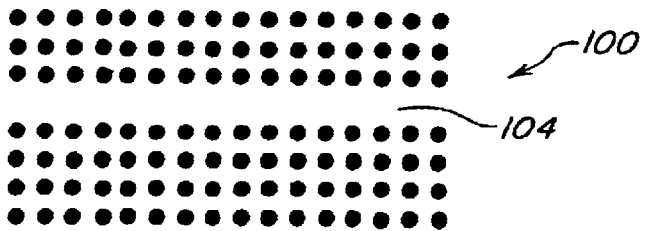
FIG. 1B is a schematic diagram of a line defect in the 2D PBG crystal.

This occurs naturally in some line defects in PBG crystals, especially in coupled resonator optical waveguides (CROWs), (but also sometimes for the class of the line defects depicted in FIG. 1B), close to the inflection point of $k(\omega)$, as illustrated in FIG. 4. FIG. 4 is a graph of another exemplary dispersion curve of the invention. The group velocity is small, and there is a large region where the dispersion is also small (this region is in this case centered around the inflection point of the curve, which in this case occurs when $\omega=1$). Furthermore, if we write $\omega(k)=\omega_0+\omega_1(k)$ (where $\omega_1(k=0)=0$), then $\omega_1(k)<<\omega_0$ over the range of ks of interest.

Figure 1C:
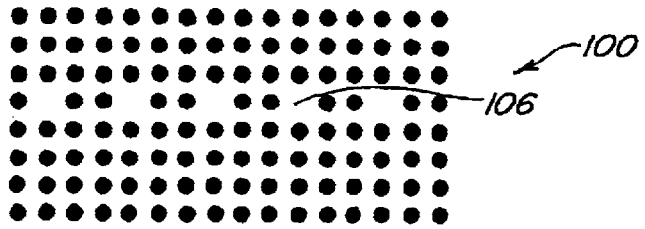
FIG. 1C is a schematic diagram of another type of line defect in the 2D PBG crystal.
Figure 1D:
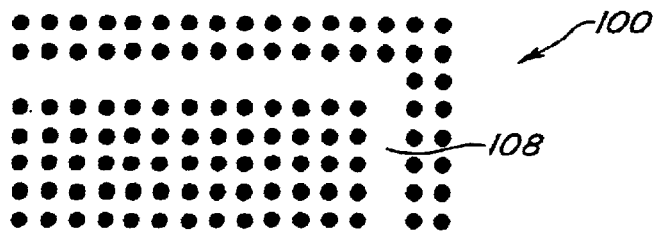
FIG. 1D is a schematic diagram of a line defect in the 2D PBG crystal that bends light at 90°

There are many different configurations using line defects in PBG crystals that can achieve the objectives of the invention. One example is configuring the device of the invention using CROWs. An example of a CROW is given in FIG. 1C. A CROW is a line defect consisting of weakly coupled cavities. The photons are tightly bound to the cavities, and they are transported down the line by hopping between the cavities. Since the coupling between the cavities is weak, the transport is slow, and the group velocity is small. One can use the well known tight-binding approximation to analyze to lowest order $\omega(k)=\Omega[1-\Delta\alpha/2+\kappa_1 \cos(kR)]$. Parameter $\kappa_1$ is $1^{st}$ order in tight-binding smallness parameters, while $\Delta\alpha$ is $2^{nd}$ order. Consequently $\Delta\alpha$ does not influence the analysis much, and $\Delta\alpha=0$ from now on. Parameter R is the real physical distance between the cavities.

Now, an external (or self-induced) stimulus is applied to the system. When the stimulus is off, the transmission of the device is 100% in all $\omega$'s; when it is on, the transmission is 0% for some range of $\omega$'s close to the central $\omega$, for which the device is optimized. In what follows, the following is assumed: applying the stimulus makes n→n+δn, where $\delta n/n=0.001$ in all parts of the upper branch. This may not be the physical system one is most likely to build. For example, one can make a device in which only δn at the cavities can be influenced. However, one should not expect the details to differ significantly among all the physical systems one is likely to build.

Figure 5C:
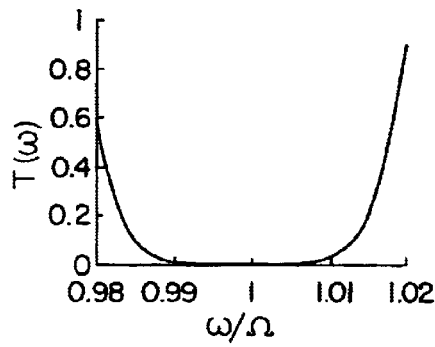
Figure 5D:
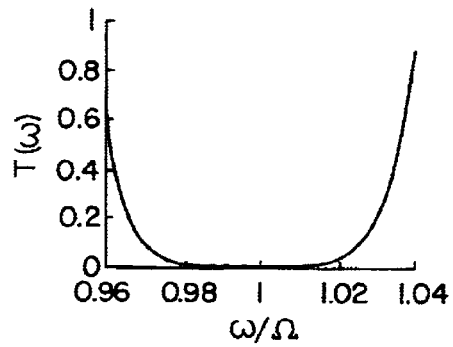

For this particular system, according to resealing properties of Maxwell's equations, $\omega(k,n+\delta n)=[n/(n+\delta n)]\omega(k,n)$ exactly. This allows one to find $k(\omega,n)$ and $k(\omega,n+\delta n)$. Next, the length of the device L is selected such that $L^*[k(\Omega,n+\delta n)-k(\Omega,n)]=\pi$. It will be appreciated that this optimizes the performance of the device at the $\omega$, which corresponds to the inflection point of $\omega(k,n)$. Finally, $|\{\exp[iL^*(k(\omega,n+\delta n)-k(\omega,n))]+1\}/2|^2$ is plotted, which gives the transmission $T(\omega) \equiv I_{OUT}(\omega)/I_{IN}(\omega)$; by plotting $T(\omega)$, as in FIGS. 5A–5D, the bandwidth of the device is determined. As can be seen from FIGS. 5A–5D, bandwidths of $Q=\Omega/\Delta\omega=50$, (or smaller) are easily achievable. FIGS. 5A–5D are graphs of transmission curves of devices of the invention for a range of $\omega$s. In FIG. 5A, $\kappa_1=-0.00625$, which makes the needed L=19.55R (where R is the distance between the cavities in the CROW). In FIG. 5B, $\kappa_1=-0.0125 \rightarrow L/R=39.23$. In FIG. 5C, $\kappa_1=-0.025 \rightarrow L/R=78.52$. In FIG. 5D, $\kappa_1=-0.05 \rightarrow L/R=157.07$. For perspective, real parameters can be analyzed. For example, if $\lambda_0=1.55$ $\mu$m, $R=1\lambda_0$, and $\kappa_1=-0.0125$. In that case, $L=60.8$ $\mu$m, and the useful bandwidth, Q is of O(100), as seen in FIG. 5B.

The speed of the device depends only on the response time to the applied stimulus, and this can be very short (a few fs is in principle achievable). It should also be noted that if the device is operated as a switch, its power requirements are necessarily rather small, because of its small volume. Similarly, if it is operated as an optical gate, its power requirements (to achieve the desired $\delta$n) are as small as one can hope for. This is so because of the high spatial concentration of the pulse (light is very localized around the line defects in PBG crystals), but also because of the high temporal compression of the pulse (due to the small group velocity). Furthermore, the length of the device is O(100 $\mu$m). The width, and tallness depend on how far apart the two branches (or the next device) need to be in order to eliminate the cross talk. For example, if the cavities are 1$\lambda$ apart, then having the next branch 4$\lambda$ apart should be enough to eliminate the cross talk. Consequently, $\lambda=1.55$ $\mu$m means that the width can be O(10 $\mu$m), and the tallness can be O(5 $\mu$m). Therefore, one can put approximately $10^5$ such devices on a surface of size 1 cm*1 cm. If one is willing to make a chip with more than one parallel plane (e.g., O(10) parallel planes, which should be achievable in 3D PBG crystals), then a chip of 1 cm*1 cm*100 $\mu$m should easily accommodate O($10^6$) such devices.

It will be appreciated that the length of the device (L) scales with 1/($\delta$n/n). Also, if (instead of influencing only the upper branch) one can, for example, make $\delta$n/n in the upper branch be the same value but opposite sign of $\delta$n/n in the lower branch, this would decrease L by a factor of 2.

CROWs are only one example of a line defect in PBG crystals that will achieve the desired performance. Any line defect in PBG crystals that has: low group velocity, and whose $k(\omega,n+\delta n)-k(\omega,n)$ is fairly independent of $\omega$ (i.e., $\partial^2 k/\partial\omega\partial n=0$,) will do the job. The defect can be either an air-like defect, or a dielectric-like defect. Nevertheless, CROWs (either air-like CROWs, or dielectric-like CROWs) have quite a few advantages. They are easy to analyze, and using CROWs one can make bends of larger transmission bandwidths than with many other line defects. Furthermore, if one wants to build an optical logical gate (where the signal itself is the stimulus for changing $\delta$n), CROWs have an additional advantage that the light is very localized at the cavities. So, the power needed to induce the required $\delta$n/n through optical non-linear effects is significantly reduced, compared to using some other line defects.

The simplest application of the device of the invention is an ON/OFF switch. The signal splits equally into two branches, and when the external stimulus (electrical or optical) is off, the signal interferes constructively at the output: thereby, the switch is on. If the external stimulus is on, the branches can be designed so that the externally induced $\delta$n makes the signal interfere destructively at the output, and the switch is off. Of course, things can be arranged so that the external stimulus off makes the switch being off, etc. At any rate, such a switch (if it is optically controlled) can also be used for optical imprinting (or wavelength conversion). Further, if the stimulus is weaker than the pulse that is being controlled (but being applied in a different physical manner), the concept of imprinting allows us to use the device also as an amplifier. Furthermore, if the switch is off, the signal is reflected back to the input. This signal, traveling backwards through the input can then be collected, and diverted into another output port. This way one can build an externally controlled router between the two different outputs.

Figure 6A:
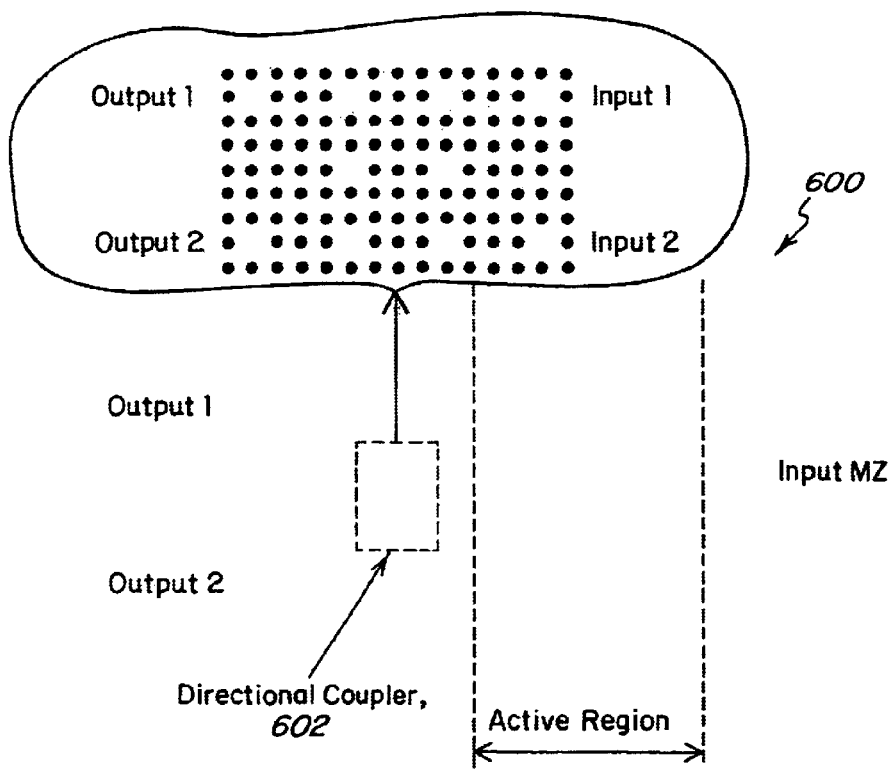
FIG. 6A is a schematic diagram of an exemplary Mach-Zehnder interferometer 600 operating as a router between two different outputs in accordance with the invention.

Another way to configure a router between two different outputs would be to terminate the Mach-Zehnder interferometer of the invention with a directional coupler device. FIG. 6A is a schematic diagram of an exemplary Mach-Zehnder interferometer 600 operating as a router between two different outputs in accordance with the invention. This is achieved by terminating the interferometer with a directional coupler 602 rather than with a T-branch, as shown in the upper panel. A particular implementation of a directional coupler is shown in the inset of FIG. 6A. In the inset, Input 1 and Input 2 denote inputs to the directional coupler 602, while Input MZ denotes the input to the entire Mach-Zehnder device. The Output 1 and Output 2 are outputs of the directional coupler. These outputs are used in turn as the outputs of the entire Mach-Zehnder device.

Figure 6B:
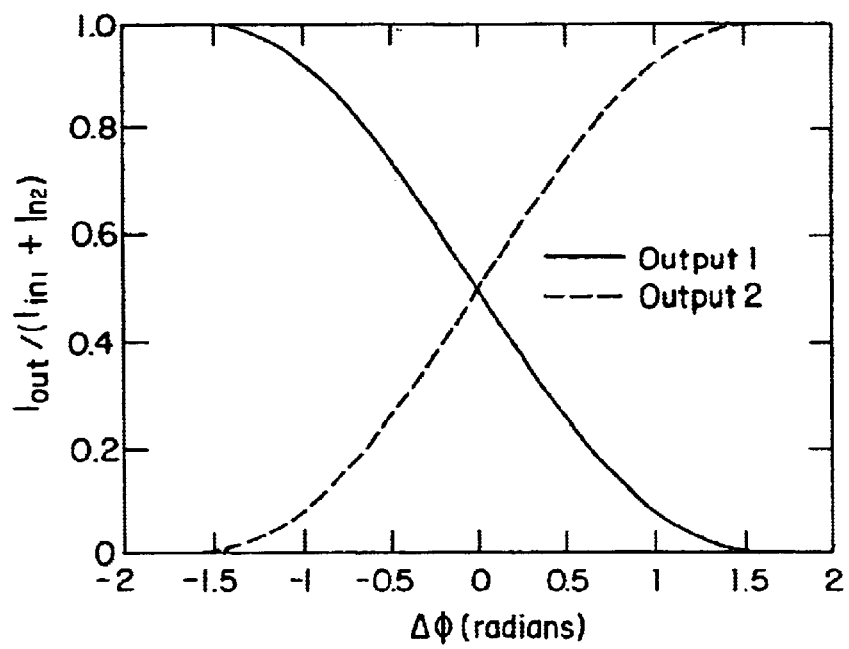
FIG. 6B is a plot of the calculated intensity at each of the two outputs, as a function of the phase difference between the upper and the lower input to the directional coupler.

FIG. 6B is a plot of the calculated intensity at each of the two outputs, as a function of the phase difference between the upper and the lower input to the directional coupler.

A directional coupler has two inputs and two outputs. If intensity coming down two inputs is the same, depending on the relative phase of the two inputs, one can have 100% of the intensity exiting at Output 1, or alternatively 100% can exit at Output 2. Almost any implementation of a directional coupler would serve this purpose.

The upper arm of the Mach-Zehnder interferometer would be coupled to the Input 1, and the lower arm would be connected to Input 2 of the directional coupler. As described, the Mach-Zehnder device would thus enable control of the relative phase of the two inputs of the L directional coupler. Thereby, one would have control of whether one observes 100% intensity at Output 1, or at Output 2 of the directional coupler.

A particularly simple implementation of the directional coupler is a channel-drop filter as described in U.S. Pat. No. 6,130,780, incorporated herein by reference. For this application, one needs only to operate it at a frequency offset from that originally intended. An advantage of this particular design is that it adds only 1$\lambda$ to the length of the entire device. The filter of U.S. Pat. No. 6,130,780 involves two linear waveguides and a coupling element (consisting of two point-defect cavities) between them as shown in the inset of FIG. 6A. Assuming the waveguides are labeled OUT1 and OUT2:

$$A_{OUT1} = A_{IN1}\left(1 - \frac{i\alpha}{\omega - \omega_0 + i\alpha}\right) - A_{IN2}\left(\frac{i\alpha}{\omega - \omega_0 + i\alpha}\right), \quad (2)$$

$$A_{OUT2} = A_{IN2}\left(1 - \frac{i\alpha}{\omega - \omega_0 + i\alpha}\right) - A_{IN1}\left(\frac{i\alpha}{\omega - \omega_0 + i\alpha}\right),$$

where $A_{OUTj}$ and $A_{INj}$ are the amplitudes at the output and input of waveguide j, respectively, the central frequency of the two coupled cavities is $\omega_0$, and $2\alpha$ is the width of the resonance. In the device of the invention, equal intensities will be coming to both inputs, so that that all the energy will exit at a single output.

Viewing from a time-reversed perspective, this suggests the directional coupler be operated at the frequency $\omega_0 \pm \alpha$, rather than operated at $\omega = \omega_0$, as is done in U.S. Pat. No. 6,130,780. This time-reversed picture also suggests that (according to Eqs. (2)) if operation is chosen to be at frequency $\omega_0 + \alpha$, one gets 100% transmission at the output of waveguide 2, if the input of waveguide 2 lags waveguide 1 in phase by exactly $\pi/2$. 100% transmission is achieved at the output of waveguide 1 if the input of waveguide 2 is $\pi/2$ ahead. The dependence of transmission on the phase difference $\Delta\phi$ between waveguides 1 and 2 is illustrated in the plot of FIG. 6B. Operating at the frequency $\omega_0 - \alpha$ reverses this relative-phase dependence.

For example, if the operating frequency is $\omega_0 + \alpha$, and it assumed that the intensities entering the device from the two waveguides are the same apart for the fact that waveguide 2 lags waveguide 1 in phase by $\pi/2$, then:

$$\frac{I_{OUT1}}{I_{IN1} + I_{IN2}} = \frac{1}{2}\frac{(\omega - \omega_0 - \alpha)^2}{(\omega - \omega_0)^2 + \alpha^2}, \quad (3)$$

$$\frac{I_{OUT2}}{I_{IN1} + I_{IN2}} = \frac{1}{2}\frac{(\omega - \omega_0 + \alpha)^2}{(\omega - \omega_0)^2 + \alpha^2},$$

where $I_{IN1,IN2}$ and $I_{OUT1,OUT2}$ denote the intensities at the inputs and outputs of the respective waveguides.

According to Eqs.(3), the useful bandwidth of this directional coupler approximately equals $2\alpha$. In contrast to U.S. Pat. No. 6,130,780, the invention is not forced to operate in the regime of very small $\alpha$; consequently, $2\alpha$ can be readily designed to be larger than the bandwidth of the Mach-Zehnder interferometer of the invention, so the directional coupler will not impair the performance of the device.

Figure 7:
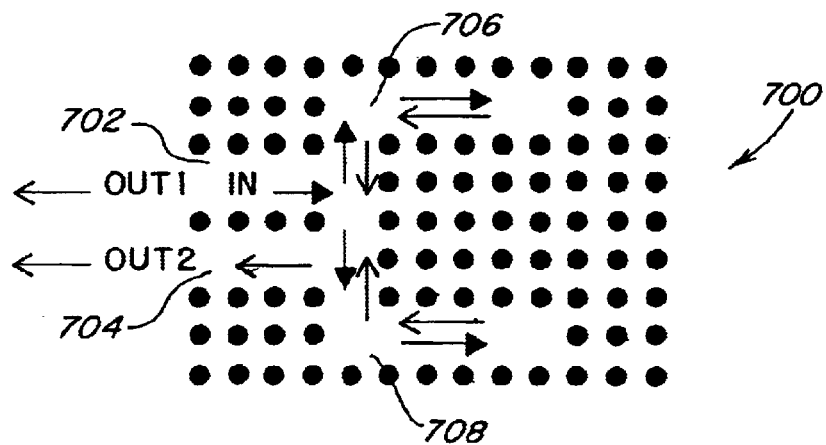
FIG. 7 is a schematic diagram of a reflecting device configured in 2D PBG crystals in accordance with the invention.

Furthermore, PBG crystals enable the saving of an additional factor of 2 in the length of the router earlier described. FIG. 7 is a schematic diagram of a reflecting device 700 configured to in 2D PBG crystals in accordance with the invention. The device 700 has respective inputs 702 and 704 for a first arm 706 and a second arm 708. Once each signal reaches the end of its own arm, it is reflected 100% backwards, and subsequently travels its own branch in the opposite direction. In this way a factor of 2 is saved on the useful length of each path. The device can then be designed so that the two signals interfere constructively at the original input (OUT1 of FIG. 7), and destructively at OUT2 (when the stimulus is on). The recombined-again signal will then travel back along the line defect it came from. When the stimulus is off, the device can be designed so that the two signals interfere constructively at OUT2, but destructively at OUT1; thereby the output signal exits at OUT2.

One can also use the invention to configure various optical logical gates. In particular, an optical AND gate is described. To build an AND gate, both of the inputs can be combined to propagate down the same line defect. Then, the combined pulse enters a device like the one in FIG. 6A. By adjusting the two arms during production, the device can be configured so that if the total intensity entering the device is very small (so that non-linearity can be neglected), the relative phase between the outputs of the upper and the lower arm is such that everything exits at output1. Furthermore, one can simultaneously adjust the device so that when the total intensity is $I_0$ (corresponding to the intensity of only one input present), this $I_0$ self-acts to produce 0 at the Output 1 of the device (the non-linearly induced change in the difference in phase shifts between the two branches is $\pi$); everything exits at output2. Assuming a Kerr non-linearity, the intensity $2I_0$ would then produce the change of the relative phase shift of $2\pi$, and $2I_0$ is achieved at the output. If dealing with a Kerr non-linearity, then the induced phase difference at the output is given by $\pi(I/I_0)$.

This configuration would be a 2-AND gate: both inputs being zero imply zero output1, exactly one of the two inputs being $I_0$ (a logical 1) implies output1 0, and both inputs being $I_0$ imply output1 $2I_0$ (a logical 2). By converting $2I_0$ into $I_0$ (in any of many possible ways), a 2-AND gate is trivially converted into the usual AND gate. Nevertheless, the 2-AND gate itself is useful for some applications, as will be appreciated. The non-linear response needs to be additive in the intensity of the two inputs, for the particular implementation described above (although other implementations are possible). This is easily achievable if the two inputs are mutually temporally incoherent, and the non-linearity performs time-averaging on the scales longer than the temporal coherence.

Now that an AND gate is obtained, it is trivial to implement a NOT gate. It will be appreciated that the Output 2 from the device above actually automatically gives us a XOR gate. If one of the inputs to a XOR gate is fixed to be a logical 1, then the XOR gate becomes a NOT gate. Knowing how to build an AND, and a NOT gate, it is trivial to implement a NAND gate.

Finally, one can configure a fan-out device using a 2-AND gate. A fan-out device is by definition a device with one input and two outputs; its purpose is to reproduce at both of its outputs whatever comes to the input. One of its inputs is fixed to always be $I_0$. The logical signal to be fanned-out comes into the other input; denote it with $I_{IN}$ (which can be either $I_0$ or 0). In this case, the Output 1 is always $2I_{IN}$. Adding a simple splitter to the Output 1 makes the device a fan-out device.

It has now been shown how to configure a NAND gate, and how to achieve fanning-out. It was shown previously how to achieve arbitrary interconnects in PBG crystals. It will be appreciated that there is a well known theorem of computer science which states that (in principle) these are the only three things one needs in order to build a universal Turing machine. Also, one can put $O(10^5)$ of the all-optical gates on surface of 1 cm*1 cm, so it is possible that a useful all-optical computer can be built this way.

In another embodiment of the invention, regular dielectric waveguides are used instead of using line defects in PBG crystals in order to guide light. In this case, there would have to be a grating written in the waveguide in order to produce the small group velocity necessary. Yet another embodiment would be not to use line defects or waveguides at all, but rather propagate signals in a regular PBG crystal, along the directions that have small group velocities (note that directions of propagation with low group velocities are very common in many PBG crystals.)

In another embodiment, one can use slow group velocity in photonic crystals to enhance magneto-optical effects, which could then be used to implement various magneto-optically active devices (like an optical insulator in a Mach-Zehnder geometry for example). Since the influence of magneto-optical effects is to change δω by a small amount, the principles described would allow one to build significantly smaller magneto-optically active devices.

In conclusion, a method and devices are described that one can use in order to build a compact, fast, wide bandwidth, and small power optical device, which is not difficult to implement in many PBG crystals. Using the principles of the invention, one can build both a switch, and also a router between two outputs, controlled with fast external stimuli. Furthermore, one can also use this principle to build various all-optical logical gates. The principle explores properties of certain line defects in PBG crystals. The line defects must be such that: they have a low group velocity, and (once the stimulus is applied) the difference between the phase shifts acquired when traversing the two branches has to be as independent of ω as possible over as wide range of ωs as possible.

Although the present invention has been shown and described with respect to several preferred embodiments thereof, various changes, omissions and additions to the form and detail thereof, may be made therein, without departing from the spirit and scope of the invention.

What is claimed is:

1. A photonic crystal interferometer comprising a periodic dielectric structure including an input having at least one input waveguide, first and second waveguide arms branching from said input waveguide in which the relative optical path lengths of electromagnetic radiation within said arms are controlled by stimuli, and an output having at least one output waveguide that completely combines the electromagnetic radiation propagating within said first and second waveguide arms, wherein said periodic dielectric structure comprises line defects having a low group velocity.

2. The photonic crystal interferometer of claim 1, wherein said periodic dielectric structure is two-dimensionally periodic.

3. The photonic crystal interferometer of claim 1, wherein said periodic dielectric structure is three-dimensionally periodic.

4. The photonic crystal interferometer of claim 1, wherein said input waveguide, said first and second arms, and said at least one output waveguide are linear defects in said periodic dielectric structure.

5. The photonic crystal interferometer of claim 1, wherein said first and second waveguide arms terminate.

6. The photonic crystal interferometer of claim 1, wherein said first and second waveguide arms combine into said at least one output waveguide.

7. The photonic crystal interferometer of claim 1, wherein said at least one output waveguide comprises two output waveguides.

8. The photonic crystal interferometer of claim 1, wherein said stimuli is external.

9. The photonic crystal interferometer of claim 8, wherein said stimuli is electrical, optical, thermal, acoustical or mechanical.

10. The photonic crystal interferometer of claim 1, wherein said stimuli is internal.

11. The photonic crystal interferometer of claim 10, wherein said stimuli is self-induced.

12. The photonic crystal interferometer of claim 1, wherein at least one arm enables control of said relative optical path length.

13. The photonic crystal interferometer of claim 1, wherein said first and second waveguide arms are configured to provide low group velocity of the electromagnetic radiation.

14. The photonic crystal interferometer of claim 13, wherein the group velocity is less than 0.01 c.

15. The photonic crystal interferometer of claim 13, wherein the group velocity is less than 0.01 c.

16. The photonic crystal interferometer of claim 13, wherein the group velocity is less than 0.001 c.

17. The photonic crystal interferometer of claim 1, wherein said first and second waveguide arms are configured to provide small dispersion of said electromagnetic radiation.

18. The photonic crystal interferometer of claim 1, wherein said first and second waveguide arms are configured to provide wide bandwidth of said electromagnetic radiation.

19. The photonic crystal interferometer of claim 1, wherein said first and second waveguide arms are configured to provide high transmission over a large bandwidth of said electromagnetic radiation when in operation.

20. The photonic crystal interferometer of claim 19, wherein the bandwidth is larger than $0.05(v_G/c)$.

21. The photonic crystal interferometer of claim 19, wherein the bandwidth is larger than $0.2(v_G/c)$.

22. The photonic crystal interferometer of claim 19, wherein the band Width is larger than $0.4(v_G/c)$.

23. The photonic crystal interferometer of claim 1, wherein said inputs comprises a directional coupler.

24. The photonic crystal interferometer of claim 1, wherein said outputs comprise a directional coupler.

25. A photonic crystal interferometer measuring device comprising a periodic dielectric structure including an input waveguide, first and second waveguide arms branching from said input waveguide in which the relative optical path lengths of electromagnetic radiation within said arms are controlled by stimuli, and at least one output waveguide that completely combines the electromagnetic radiation propagating within said first and second waveguide arms, wherein said periodic dielectric structure comprises line defects having a low group velocity.

26. A photonic crystal optical switch comprising a periodic dielectric structure including an input waveguide, first and second waveguide arms branching from said input waveguide in which the relative optical path lengths of electromagnetic radiation within said arms are controlled by stimuli, and at least one output waveguide that completely combines the electromagnetic radiation propagating within said first and second waveguide arms, wherein said periodic dielectric structure comprises line defects having a low group velocity.

27. A photonic crystal optical router comprising a periodic dielectric structure including an input waveguide, first and second waveguide arms branching from said input waveguide in which the relative optical path lengths of electromagnetic radiation within said arms are controlled by stimuli, and at least one output waveguide that completely combines the electromagnetic radiation propagating within said first and second waveguide arms, wherein said periodic dielectric structure comprises line defects having a low group velocity.

28. A photonic crystal logic gate comprising a periodic dielectric structure including an input waveguide, first and second waveguide arms branching from said input waveguide in which the relative optical path lengths of electromagnetic radiation within said arms are controlled by stimuli, and at least one output waveguide that completely combines the electromagnetic radiation propagating within said first and second waveguide arms, wherein said periodic dielectric structure comprises line defects having a low group velocity.

29. A photonic crystal optical insulator comprising a periodic dielectric structure including at least one input waveguide, first and second waveguide arms branching from said input, having magneto-optically active material, in which the relative optical path lengths of electromagnetic radiation within said arms differ depending on the propagation direction due to magneto-optically active material, and at least one output waveguide that completely combines the electromagnetic radiation propagating within said first and second waveguide arms, wherein said periodic dielectric structure comprises line defects having a low group velocity.

* * * * *